United States Patent
Li et al.

(10) Patent No.: US 11,227,882 B2
(45) Date of Patent: Jan. 18, 2022

(54) THIN FILM TRANSISTOR, METHOD FOR FABRICATING THE SAME, DISPLAY SUBSTRATE, AND DISPLAY DEVICE

(71) Applicant: BOE TECHNOLOGY GROUP CO., LTD., Beijing (CN)

(72) Inventors: Xiaolong Li, Beijing (CN); Dong Li, Beijing (CN); Huijuan Zhang, Beijing (CN); Zheng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 719 days.

(21) Appl. No.: 16/077,777

(22) PCT Filed: Dec. 13, 2017

(86) PCT No.: PCT/CN2017/115887
§ 371 (c)(1),
(2) Date: Aug. 14, 2018

(87) PCT Pub. No.: WO2018/145515
PCT Pub. Date: Aug. 16, 2018

(65) Prior Publication Data
US 2021/0193700 A1    Jun. 24, 2021

(51) Int. Cl.
*H01L 27/12*    (2006.01)
*H01L 29/66*    (2006.01)
(Continued)

(52) U.S. Cl.
CPC ...... *H01L 27/1285* (2013.01); *H01L 27/1222* (2013.01); *H01L 27/1281* (2013.01);
(Continued)

(58) Field of Classification Search
CPC ............ H01L 27/1285; H01L 27/1222; H01L 51/529
See application file for complete search history.

(56) References Cited

U.S. PATENT DOCUMENTS

| 2014/0070217 A1* | 3/2014 | Liu | H01L 29/78669 257/57 |
| 2016/0020096 A1* | 1/2016 | Zhang | H01L 21/02686 257/66 |

(Continued)

FOREIGN PATENT DOCUMENTS

CN    101673528 A    3/2010

OTHER PUBLICATIONS

Second Office Action for Chinese Patent Application No. 201710011269.3 dated Nov. 15, 2018.

*Primary Examiner* — Ahmed N Sefer
(74) *Attorney, Agent, or Firm* — Calfee, Halter & Griswold LLP

(57) ABSTRACT

A thin film transistor, a method for fabricating the same, a display substrate, and a display device are disclosed. The thin film transistor includes a gate, a source, a drain, and an active layer. Forming the active layer includes: forming a pattern comprising a thermal insulation layer; forming a pattern comprising an amorphous silicon layer on the thermal insulation layer, wherein the pattern comprising the amorphous silicon layer includes a first portion on the thermal insulation layer and a second portion extending beyond the thermal insulation layer; and treating the pattern comprising the amorphous silicon layer with a laser annealing process, so that the amorphous silicon layer grows grain in a direction from the second portion to the first portion to form the active layer from polycrystalline silicon.

11 Claims, 2 Drawing Sheets

(51) Int. Cl.
*H01L 29/786* (2006.01)
*H01L 51/52* (2006.01)

(52) U.S. Cl.
CPC .. *H01L 29/66757* (2013.01); *H01L 29/78675* (2013.01); *H01L 51/529* (2013.01)

(56) References Cited

U.S. PATENT DOCUMENTS

| | | | |
|---|---|---|---|
| 2017/0005115 A1* | 1/2017 | Wang | H01L 29/66757 |
| 2017/0033134 A1* | 2/2017 | Zhang | H01L 27/1262 |
| 2017/0250207 A1* | 8/2017 | Wang | H01L 27/1288 |
| 2019/0011772 A1* | 1/2019 | Yao | H01L 29/78633 |
| 2020/0144345 A1* | 5/2020 | Cha | H01L 27/3265 |

* cited by examiner

THIN FILM TRANSISTOR, METHOD FOR FABRICATING THE SAME, DISPLAY SUBSTRATE, AND DISPLAY DEVICE

RELATED APPLICATIONS

The present application is the U.S. national phase entry of PCT/CN2017/115887, with an international filing date of Dec. 13, 2017, which claims the benefit of Chinese Patent Application No. 201710071073.3, filed Feb. 9, 2017, the entire disclosures of which are incorporated herein by reference.

TECHNICAL FIELD

The present disclosure relates to the field of display technologies, and particularly to a thin film transistor and method for fabricating the same, a display substrate, and a display device.

BACKGROUND

An active matrix organic light emitting diode (AMOLED) panel has advantages of a low power consumption, a low fabrication cost, a wide viewing angle, a fast response speed, and thus has gradually replaced the conventional liquid crystal display.

Currently in an AMOLED, an organic light emitting layer is driven by a Drive Thin Film Transistor (DTFT) to emit light. For purpose that the DTFT has a relatively high carrier mobility, a low temperature polycrystalline silicon is generally applied to form an active layer of the DTFT.

In the low temperature polycrystalline silicon film, due to the presence of large amount of grain boundary defect states, the thin film transistor has an unstable threshold voltage and a poor carrier mobility. When the thin film transistor is downscaled, the problem of unstable threshold voltage will become more serious. Currently, a method comprising two steps by using ELA and a CW solid state laser is generally applied to improve the uniformity of a low temperature polycrystalline silicon film, but this causes an increased cost and a complex process, which is not conducive to practical applications.

SUMMARY

In an aspect, embodiments of the present disclosure provide a method for fabricating thin film transistor, the thin film transistor comprises a gate, a source, a drain, and an active layer, a step of forming the active layer comprises:

forming a pattern comprising a thermal insulation layer;

forming a pattern comprising an amorphous silicon layer on the thermal insulation layer, wherein the pattern comprising the amorphous silicon layer comprises a first portion on the thermal insulation layer and a second portion extending beyond the thermal insulation layer; and treating the pattern comprising the amorphous silicon layer with a laser annealing process to form the active layer from polycrystalline silicon.

In an embodiment, forming the pattern comprising the thermal insulation layer comprises:

preparing a substrate;

depositing a layer of buffer material and a layer of thermal insulation material on the substrate, wherein the buffer material has a thickness smaller than a thickness of the thermal insulation material; and patterning the layer thermal insulation material to form the pattern comprising the thermal insulation layer.

In an embodiment, forming the pattern comprising the amorphous silicon layer on the pattern comprising the thermal insulation layer comprises:

depositing a layer of amorphous silicon on the substrate on which the pattern comprising the thermal insulation layer has been formed; and patterning the layer of amorphous silicon to form the pattern comprising the amorphous silicon layer, wherein the amorphous silicon layer has an elongated shape, and comprises a first end portion, a second end portion opposite to the first end portion, and a middle portion between the first end portion and the second end portion, the middle portion is arranged on the thermal insulation layer, and at least one of the first end portion and the second end portion extends beyond the thermal insulation layer.

In an embodiment, both the first end portion and the second end portion extend beyond the thermal insulation layer.

In an embodiment, the first end portion extends beyond the thermal insulation layer by a length of 1-1.5 µm.

In an embodiment, the second end portion extends beyond the thermal insulation layer by a length of 1-1.5 µm.

In an embodiment, the thermal insulation layer has an elongated shape, the thermal insulation layer has a same extending direction as the amorphous silicon layer, and the thermal insulation layer has a width in a direction perpendicular with the extending direction larger than a width of the middle portion in a direction perpendicular with the extending direction.

In an embodiment, the width of the thermal insulation layer in the direction perpendicular with the extending direction is larger than the width of the middle portion in the direction perpendicular with the extending direction by 1-2 µm.

In an embodiment, the buffer material is SiNx, and has a thickness of 50-100 nm.

In an embodiment, the thermal insulation material is $SiO_2$, and has a thickness of 250-350 nm.

In an embodiment, during the laser annealing process, the laser has energy of 350 $mJ/cm^2$-450 $mJ/cm^2$, and has a radiating duration of 7-8 minutes.

In another aspect, embodiments of the present disclosure further provide a thin film transistor, which is fabricated the fabricating method as described above, wherein the thin film transistor comprises an active layer which is formed on a thermal insulation layer from polycrystalline silicon, and the active layer comprises a portion on the thermal insulation layer and a portion extending beyond the thermal insulation layer.

In yet another aspect, embodiments of the present disclosure further provide a display substrate, comprising the thin film transistor as described above.

In yet another aspect, embodiments of the present disclosure further provide a display device, comprising the display substrate as described above.

DETAILED DESCRIPTION OF EMBODIMENTS

Figure 1:
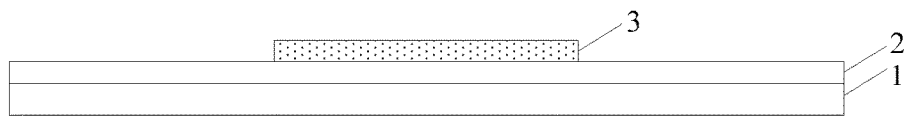
FIG. 1 is a cross-sectional view for illustrating an active layer in a low temperature polycrystalline silicon thin film transistor in the prior art.

The present disclosure will be described in detail hereinafter with reference to the accompanying drawings and specific implementations, for purpose of better conveying technical solutions of the present disclosure to the skilled in the art.

Unless otherwise defined, the technical or scientific terms used in the present invention shall have the general meanings understandable for those ordinarily skilled in the field of the present disclosure. The wordings such as "first", "second" or similar used in the description and claims of the present invention shall not represent any order, number or importance, but are used for distinguishing different elements. Similarly, the words such as "an", "a" or similar shall not represent limitation of numbers, but mean existence of at least one. The words "comprise", "include" or similar indicate an element or article preceding these words shall contain elements or articles listed behind these words and equivalents thereto, and do not exclude the presence of elements or articles other than those listed. The phrases "upper", "lower", "left", "right" and etc. shall be used only to represent relative positions, wherein, when the absolute position of the described object is changed, the relative positions may be changed accordingly.

It will be understood that when an element or layer is referred to as being "on", "connected to" or "coupled to" another element or layer, it can be directly on, connected or coupled to the other element or layer or intervening elements or layers may be present.

Reference numerals: 1 substrate; 2 buffer layer; 3 active layer; 4 buffer layer; 5 thermal insulation layer; 6 amorphous silicon layer; 7 active layer.

As shown in FIG. 1, in a low temperature polycrystalline silicon substrate, a buffer layer 2 is generally formed on a substrate 1, and an active layer 3 is formed on the buffer layer 2 from a low temperature polycrystalline silicon film. The presence of large amount of grain boundary defect states in the low temperature polycrystalline silicon film leads to an unstable threshold voltage and a poor carrier mobility of the thin film transistor. When the thin film transistor is downscaled, the problem of unstable threshold voltage will become more serious. Currently, a method comprising two steps by using ELA and a CW solid state laser is generally applied to improve the uniformity of a low temperature polycrystalline silicon film, but this causes an increased cost and a complex process, which is not conducive to practical applications.

In order to solve the above problem, embodiments of the present disclosure provide a thin film transistor, a method for fabricating the same, a display substrate, and a display device. An active layer of polycrystalline silicon with larger grain size and improved uniformity can be fabricated at a low cost, and the stability of carrier mobility and threshold voltage of the thin film transistor can be improved.

Embodiments of the present disclosure provide a method for fabricating thin film transistor, the thin film transistor comprises a gate, a source, a drain, and an active layer, a step of forming the active layer comprises:

forming a pattern comprising a thermal insulation layer;

forming a pattern comprising an amorphous silicon layer on the thermal insulation layer, wherein the pattern comprising the amorphous silicon layer comprises a first portion on the thermal insulation layer and a second portion extending beyond the thermal insulation layer; and treating the pattern comprising the amorphous silicon layer with a laser annealing process to form the active layer from polycrystalline silicon.

In the present embodiment, the pattern comprising the amorphous silicon layer comprises a first portion on the thermal insulation layer and a second portion extending beyond the thermal insulation layer. Upon laser annealing of the amorphous silicon layer, the second portion extending beyond the thermal insulation layer is cooled down relatively quickly and thus nucleates first, and the first portion is cooled down relatively slowly and thus nucleates slowly. In this way, grains grow in the amorphous silicon layer in a direction from the second portion to the first portion, so that the growth direction of grains can be controlled, and uniformity of polycrystalline silicon can be increased. Since the first portion is formed on the thermal insulation layer, due to the presence of the thermal insulation layer, the first portion can be cooled down relatively slowly, and the resulting grains are relatively large. As a result, an active layer of polycrystalline silicon with larger grain size and improved uniformity can be fabricated at a low cost, and the stability of carrier mobility and threshold voltage of the thin film transistor can be improved.

The amorphous silicon layer is arranged on and contacts the thermal insulation layer first portion. In case both the thermal insulation layer and the amorphous silicon layer are formed on the substrate, an orthogonal projection of the first portion on the substrate falls within an orthogonal projection of the thermal insulation layer on the substrate, and an orthogonal projection of the second portion on the substrate is located outside the orthogonal projection of the thermal insulation layer on the substrate.

The thermal insulation layer is generally made from an inorganic material with a relatively slow cooling rate, and the cooling rate of the thermal insulation layer is smaller than that of the substrate. Thus, upon laser annealing of the amorphous silicon layer, the amorphous silicon layer formed on the thermal insulation layer decreases relatively slowly in temperature.

In order to prevent some impurity ions in the substrate from escaping into other layers, which would affect the performance of thin film transistor, a buffer layer is further arranged between the thermal insulation layer and the substrate. In particular, forming the pattern comprising the thermal insulation layer comprises:

preparing a substrate;

depositing a layer of buffer material and a layer of thermal insulation material on the substrate, wherein the buffer material has a thickness smaller than a thickness of the thermal insulation material; and patterning the layer thermal insulation material to form the pattern comprising the thermal insulation layer.

The buffer material and the thermal insulation material are made from different inorganic materials. The buffer layer also has a heat insulation effect. In case the buffer layer arrange has a large thickness, the difference in cooling rate between the first portion and the second portion during cooling down will be small, because the second portion is arranged on the buffer layer. Thus, the buffer layer is relatively thin and the thermal insulation layer is relatively thick, so that the difference in cooling rate between the first portion and the second portion is relatively large during cooling down. In particular, the buffer material can be made from SiNx with a thickness of 50-100 nm, and the thermal insulation material can be made from $SiO_2$ with a thickness of 250-350 nm.

In a specific implementation, forming the pattern comprising the amorphous silicon layer on the pattern comprising the thermal insulation layer comprises:

depositing a layer of amorphous silicon on the substrate on which the pattern comprising the thermal insulation layer has been formed; and patterning the layer of amorphous silicon to form the pattern comprising the amorphous silicon layer, wherein the amorphous silicon layer has an elongated shape, and comprises a first end portion, a second end portion opposite to the first end portion, and a middle portion between the first end portion and the second end portion, the middle portion is arranged on the thermal insulation layer, and at least one of the first end portion and the second end portion extends beyond the thermal insulation layer.

The elongated shape indicates that the pattern comprising the amorphous silicon layer has a shape with a width much smaller than a length. In particular, the pattern comprising the amorphous silicon layer can have a shape of a straight line, a wavy line, a bow or the like. The pattern comprising the amorphous silicon layer can also comprise a plurality of end portions, but not limited to two end portions. However, in order to control the growth direction of grains and increase uniformity of polycrystalline silicon, too many end portions are not desired. For example, the pattern comprising the amorphous silicon layer comprises two end portions.

At least one of the first end portion and the second end portion of the pattern comprising the amorphous silicon layer extends beyond the thermal insulation layer. Upon laser annealing of the amorphous silicon layer, the end portion extending beyond the thermal insulation layer is cooled down relatively quickly and nucleates first, and the other portions are cooled down relatively slowly and nucleate slowly. In this way, grains grow in the amorphous silicon layer in a direction from the end portion extending beyond the thermal insulation layer to the middle portion, so that the growth direction of grains can be controlled, and uniformity of polycrystalline silicon can be increased. Since the middle portion is formed on the thermal insulation layer, due to the presence of the thermal insulation layer, the end portion on the thermal insulation layer and/or the middle portion can be cooled down relatively slowly, and the resulting grains are relatively large.

In an embodiment, both the first end portion and the second end portion extend beyond the thermal insulation layer. Upon laser annealing of the amorphous silicon layer, grains can grow in both a direction from the first end portion to the middle portion and a direction from the second end portion to the middle portion. This increases the grow rate of grains, so that growth of grains is complete prior to cooling down the thermal insulation layer, and the size of the resulting grains is increased.

In case the pattern comprising the amorphous silicon layer has a portion extending beyond the thermal insulation layer, the portion by which the pattern comprising the amorphous silicon layer extends beyond the thermal insulation layer is not too long. This is because this portion only helps to control the growth direction of grains. Since this portion is located outside the thermal insulation layer, it is cooled down relatively slowly, and the resulting grains are relatively small. In particular, the first end portion extends beyond the thermal insulation layer by a length of 1-1.5 µm, and the second end portion extends beyond the thermal insulation layer by a length of 1-1.5 µm.

Further, the thermal insulation layer can also have an elongated shape, which matches the shape of the pattern comprising the amorphous silicon layer. The thermal insulation layer has a same extending direction as the amorphous silicon layer, and the thermal insulation layer has a width in a direction perpendicular with the extending direction larger than a width of the middle portion in a direction perpendicular with the extending direction. This ensures that other portions of the pattern comprising the amorphous silicon layer than the end portions are arranged on the thermal insulation layer.

In the technical solution of the present embodiment, it is only required that other portions of the pattern comprising the amorphous silicon layer than the end portions. Thus, the width of the thermal insulation layer is not required to be large. The thermal insulation layer can have a width in a direction perpendicular with the extending direction larger than the width of the middle portion in a direction perpendicular with the extending direction by 1-2 µm.

Of course, it is possible that the shape of the thermal insulation layer does not match that of the pattern comprising the amorphous silicon layer. The thermal insulation layer further can have a shape of a circle, square, or the like, provided that the first portion of the pattern comprising the amorphous silicon layer is arranged on the thermal insulation layer, and the second portion extends beyond the thermal insulation layer.

Further, during the laser annealing process, the laser has energy of 350 $mJ/cm^2$-450 $mJ/cm^2$, and has a radiating duration of 7-8 minutes. Of course, other process parameters that the above parameters can further be used for the laser annealing process. The method for fabricating an active layer of a thin film transistor in embodiments of the present disclosure will be described hereinafter with reference to the drawings.

Figure 2:
FIG. 2 is a schematic view for illustrating a buffer layer and a thermal insulation layer on a substrate in an embodiment of the present disclosure.

In step 1, as shown in FIG. 2, the substrate 1 is provided, and a buffer layer 4 and a thermal insulation layer 5 are formed on the substrate 1.

The substrate 1 can be a glass substrate or a quartz substrate. In particular, after the substrate 1 is cleaned, the buffer layer 4 with a thickness of 50-100 nm can be deposited on the substrate 1 by plasma enhanced chemical vapor deposit (PECVD). The buffer layer 4 can completely cover the substrate 1, and can prevent impurity ions in the substrate 1 from diffusing outward, which would affect performance of the thin film transistor. The buffer layer 4 can be made from oxide, nitride or oxynitride, and particularly can be made from SiNx.

The thermal insulation layer 5 with a thickness of 250-350 nm can be deposited on the buffer layer 4 by PECVD. The thermal insulation layer 5 can be made from oxide, nitride or oxynitride, and particularly can be made from $SiO_2$.

Figure 3:
FIG. 3 is a schematic view for illustrating patterning a thermal insulation layer in an embodiment of the present disclosure.

In step 2, as shown in FIG. 3, the thermal insulation layer 5 is patterned to form a pattern comprising the thermal insulation layer 5.

In particular, a layer of photoresist is coated on the thermal insulation layer 5. The photoresist is exposed with a mask plate, so that the photoresist forms a photoresist removed (not retained) region and a photoresist retained region. The photoresist retained region corresponds with a region where the pattern comprising the thermal insulation layer 5 is located, and the photoresist removed region corresponds with the remaining region where the above pattern is not located. A development treatment is performed, so that the photoresist in the photoresist removed region is completely removed, the photoresist in the photoresist retained region remain a constant thickness. The thermal insulation layer 5 in the photoresist removed region is completely etched away by an etching process, and the remaining photoresist is peeled off, to form the pattern comprising the thermal insulation layer 5.

Figure 7:
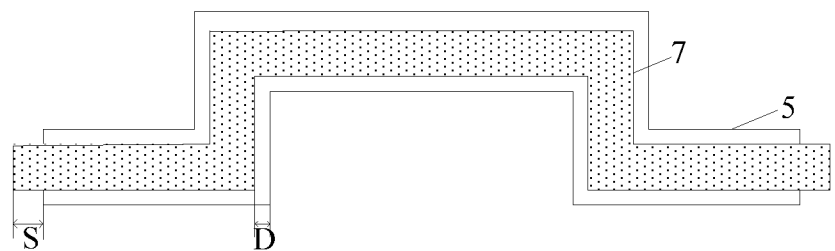
FIG. 7 is a plan view for illustrating an active layer of a thin film transistor in an embodiment of the present disclosure.

In particular, as shown in FIG. 7, the pattern comprising the thermal insulation layer 5 has a substantially elongated shape, which comprises a first segment, a second segment, a third segment, a fourth segment and a fifth segment which are connected head to tail in this order. The first segment is perpendicular with the second segment, the second segment is perpendicular with the third segment, the third segment is perpendicular with the fourth segment, and the fourth segment is perpendicular with the fifth segment.

Figure 4:
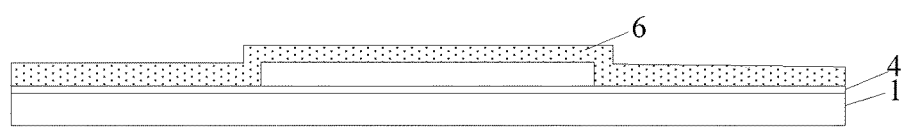
FIG. 4 is a schematic view for illustrating depositing an amorphous silicon layer in an embodiment of the present disclosure.

In step 3, as shown in FIG. 4, an amorphous silicon layer 6 is deposited on the substrate 1 from step 2.

As for the amorphous silicon layer 6, a-Si with a thickness of 40-50 nm can be deposited on the substrate 1 by plasma enhanced chemical vapor deposit (PECVD), and is dehydrogenated in an oven (high temperature annealing).

Figure 5:
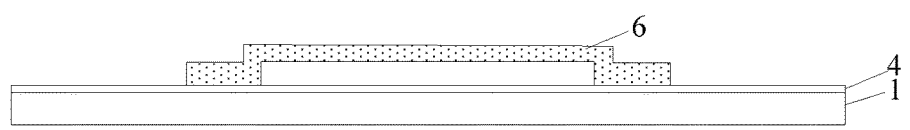
FIG. 5 is a schematic view for illustrating patterning an amorphous silicon layer in an embodiment of the present disclosure.

In step 4, as shown in FIG. 5, the amorphous silicon layer 6 is patterned to form a pattern comprising the amorphous silicon layer 6;

In particular, a layer of photoresist is coated on the amorphous silicon layer 6, and is exposed with a mask plate, so that the photoresist removed region and the photoresist retained region are formed. The photoresist retained region corresponds with a region where the pattern comprising the amorphous silicon layer 6 is located, and the photoresist removed region corresponds with the remaining region where the above pattern is not located. A development treatment is performed, so that the photoresist in the photoresist removed region is completely removed, and the photoresist in the photoresist retained region remain a constant thickness. The amorphous silicon layer 6 in the photoresist removed region is completely etched away by an etching process, and the remaining photoresist is peeled off to form the pattern comprising the amorphous silicon layer 6.

In particular, as shown in FIG. 7, the amorphous silicon layer 6 has a substantially elongated shape, which comprises a first end portion at an end, a second end portion at the other end, and a middle portion between the first end portion and the second end portion. The middle portion is arranged on the thermal insulation layer. Both the first end portion and the second end portion extend beyond the thermal insulation layer by a length S of 1-1.5 μm.

The thermal insulation layer 5 extends beyond the middle portion of the amorphous silicon layer 6 in a direction perpendicular with their extending direction by a width D of 1-2 μm.

Figure 6:
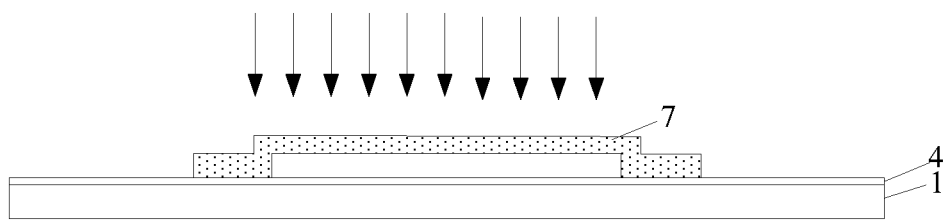
FIG. 6 is a schematic view for illustrating excimer laser annealing an amorphous silicon layer in an embodiment of the present disclosure.

In step 5, as shown in FIG. 6, the pattern comprising the amorphous silicon layer 6 is subject to an ELA process to obtain an active layer 7.

An excimer laser annealing process is used to convert the amorphous silicon into polycrystalline silicon. The laser has energy of 350 mJ/cm$^2$-450 mJ/cm$^2$, and has a radiating duration of 7-8 minutes.

After laser annealing of the amorphous silicon layer 6, the first end portion and the second end portion of the amorphous silicon layer 6 which extend beyond the thermal insulation layer 5 are cooled down relatively quickly and thus nucleate firstly, while the middle portion is cooled down relatively slowly and thus nucleates slowly. In this way, grains grow in the amorphous silicon layer in a direction from the first end portion to the middle portion and from the second end portion to the middle portion, so that the growth direction of grains can be controlled, and uniformity of polycrystalline silicon can be increased. Since the middle portion is formed on the thermal insulation layer 5, due to the presence of the thermal insulation layer 5, the middle portion can be cooled down relatively slowly, and the resulting grains are relatively large. As a result, an active layer of polycrystalline silicon with larger grain size and improved uniformity can be fabricated at a low cost, and the stability of carrier mobility and threshold voltage of the thin film transistor can be improved.

The active layer of the thin film transistor is formed by the above steps 1-5. A gate insulating layer, a gate, an interlayer insulating layer, a source, and a drain can be formed subsequently with the known process, to complete the thin film transistor.

Embodiments of the present disclosure provide a thin film transistor, which is fabricated by the fabricating method as described above. The thin film transistor comprises an active layer on the thermal insulation layer which is made from polycrystalline silicon, and the active layer comprises a portion on the thermal insulation layer and a portion extending beyond the thermal insulation layer.

During forming the active layer of the thin film transistor, the pattern comprising the amorphous silicon layer is formed on the thermal insulation layer. The pattern comprising the amorphous silicon layer comprises a first portion which is arranged on the thermal insulation layer and a second portion which extends beyond the thermal insulation layer. The pattern comprising the amorphous silicon layer is subject to a laser annealing process. Upon laser annealing of the amorphous silicon layer, the second portion extending beyond the thermal insulation layer is cooled down relatively quickly and thus nucleates first, and the first portion is cooled down relatively slowly and thus nucleates slowly. In this way, grains grow in the amorphous silicon layer in a direction from the second portion to the first portion, so that the growth direction of grains can be controlled, and uniformity of polycrystalline silicon can be increased. Since the first portion is formed on the thermal insulation layer, due to the presence of the thermal insulation layer, the first portion can be cooled down relatively slowly, and the resulting grains are relatively large. As a result, an active layer of polycrystalline silicon with larger grain size and improved uniformity can be fabricated at a low cost, and the stability of carrier mobility and threshold voltage of the thin film transistor can be improved.

Embodiments of the present disclosure provide a display substrate, comprising the thin film transistor as described above. Since the above thin film transistor has a relatively high carrier mobility and a relatively stable threshold voltage. As compared with the existing display substrate, the display substrate of embodiments of the present disclosure has a more reliable performance.

Embodiments of the present disclosure further provide a display device, comprising the display substrate as described above. The display device can be any product or component with a display function like a display panel, a liquid crystal TV, a liquid crystal display, a digital photo frame, a mobile phone, a tablet computer, TV. The display device further comprises a flexible circuit board, a printed circuit board, and a backplate.

In embodiments about methods of the present disclosure, the numerical number of steps does not define the sequential order in which these steps are performed. It will be appreciated by the person with ordinary skill in the art that the variation in the sequence of steps without creative work fall within the protection scope of the present disclosure.

The person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating a thin film transistor, the thin film transistor comprises a gate, a source, a drain, and an active layer, wherein a step of forming the active layer comprises:
    forming a pattern comprising a thermal insulation layer;
    forming a pattern comprising an amorphous silicon layer on the thermal insulation layer, wherein the pattern comprising the amorphous silicon layer comprises a first portion on the thermal insulation layer and a second portion extending beyond the thermal insulation layer; and
    treating the pattern comprising the amorphous silicon layer with a laser annealing process to form the active layer from polycrystalline silicon;
    wherein forming the pattern comprising the thermal insulation layer comprises:
    preparing a substrate;
    depositing a layer of buffer material and a layer of thermal insulation material on the substrate, wherein the buffer material has a thickness smaller than a thickness of the thermal insulation material; and
    patterning the layer thermal insulation material to form the pattern comprising the thermal insulation layer;
    wherein forming the pattern comprising the amorphous silicon layer on the pattern comprising the thermal insulation layer comprises:
    depositing a layer of amorphous silicon on the substrate on which the pattern comprising the thermal insulation layer has been formed; and
    patterning the layer amorphous silicon to form the pattern comprising the amorphous silicon layer, wherein the amorphous silicon layer has an elongated shape, and comprises a first end portion, a second end portion opposite to the first end portion, and a middle portion between the first end portion and the second end portion, the middle portion is arranged on the thermal insulation layer, and at least one of the first end portion and the second end portion extends beyond the thermal insulation layer; and
    wherein the thermal insulation layer has an elongated shape, the thermal insulation layer has a same extending direction as the amorphous silicon layer, and the thermal insulation layer has a width in a direction perpendicular with the extending direction larger than a width of the middle portion in a direction perpendicular with the extending direction.

2. The method for fabricating a thin film transistor of claim 1, wherein both the first end portion and the second end portion extend beyond the thermal insulation layer.

3. The method for fabricating a thin film transistor of claim 1, wherein the first end portion extends beyond the thermal insulation layer by a length of 1-1.5 μm.

4. The method for fabricating a thin film transistor of claim 1, wherein the second end portion extends beyond the thermal insulation layer by a length of 1-1.5 μm.

5. The method for fabricating a thin film transistor of claim 1, wherein the width of the thermal insulation layer in the direction perpendicular with the extending direction is larger than the width of the middle portion in the direction perpendicular with the extending direction by 1-2 μm.

6. The method for fabricating a thin film transistor of claim 1, wherein the buffer material is SiNx, and has a thickness of 50-100 nm.

7. The method for fabricating a thin film transistor of claim 1, wherein the thermal insulation material is $SiO_2$, and has a thickness of 250-350 nm.

8. The method for fabricating a thin film transistor of claim 1, wherein during the laser annealing process, the laser has energy of 350 $mJ/cm^2$-450 $mJ/cm^2$, and has a radiating duration of 7-8 minutes.

9. A thin film transistor fabricated by the method of claim 1, wherein the thin film transistor comprises an active layer which is formed on a thermal insulation layer from polycrystalline silicon, and the active layer comprises a portion on the thermal insulation layer and a portion extending beyond the thermal insulation layer.

10. A display substrate, comprising the thin film transistor of claim 9.

11. A display device, comprising the display substrate of claim 10.

* * * * *